(12) United States Patent
Smith et al.

(10) Patent No.: US 11,369,034 B2
(45) Date of Patent: Jun. 21, 2022

(54) EJECTABLE CASSETTE, GUIDE COLUMN, AND EJECTABLE CASSETTE SYSTEM

(71) Applicant: Ortronics, Inc., New London, CT (US)

(72) Inventors: Daniel M. Smith, Westerly, RI (US); Thomas Knychalski, Wakefield, RI (US); Ryan J. Grandidge, Wakefield, RI (US); Rudolph A. Montgelas, West Hartford, CT (US)

(73) Assignee: Ortronics, Inc., New London, CT (US)

( * ) Notice: Subject to any disclaimer, the term of this patent is extended or adjusted under 35 U.S.C. 154(b) by 396 days.

(21) Appl. No.: 16/575,012

(22) Filed: Sep. 18, 2019

(65) Prior Publication Data

US 2021/0084788 A1 Mar. 18, 2021

(51) Int. Cl.
*H05K 7/14* (2006.01)
*H05K 5/02* (2006.01)

(52) U.S. Cl.
CPC ......... *H05K 7/1491* (2013.01); *H05K 5/0221* (2013.01); *H05K 5/0295* (2013.01)

(58) Field of Classification Search
CPC ... H05K 7/1491; H05K 5/0221; H05K 5/0295
See application file for complete search history.

(56) References Cited

U.S. PATENT DOCUMENTS

| | | | | |
|---|---|---|---|---|
| 3,899,229 A | * | 8/1975 | Ackeret | G11B 23/0233 312/9.57 |
| 3,926,310 A | * | 12/1975 | Ackeret | G11B 23/0233 206/387.12 |
| 4,163,997 A | * | 8/1979 | Sugihara | G11B 15/093 360/137 |
| 4,640,415 A | * | 2/1987 | Ackeret | G11B 23/023 206/308.1 |
| 4,678,245 A | * | 7/1987 | Fouassier | G11B 33/04 206/308.1 |
| 4,986,762 A | | 1/1991 | Keith | |

(Continued)

FOREIGN PATENT DOCUMENTS

| EP | 20196427.7 | 9/2020 |
|---|---|---|
| JP | 2007221534 A | 8/2007 |

OTHER PUBLICATIONS

European Search Report and Written Opinion dated Jan. 27, 2021 from related European Application No. 20196427.7.

(Continued)

*Primary Examiner* — Anita M King
(74) *Attorney, Agent, or Firm* — McCarter & English, LLP

(57) ABSTRACT

An example ejectable cassette, guide column, and ejectable cassette system is provided. The ejectable cassette includes a housing including a proximal end, a distal end, a first side, and a second side. The ejectable cassette includes a first locking mechanism assembly at the first side of the housing. The first locking mechanism assembly includes a first locking tab slidably disposed along the first locking mechanism assembly. The first locking tab is biased towards the proximal end of the housing. The ejectable cassette includes a second locking mechanism assembly at the second side of the housing. The second locking mechanism assembly includes a second locking tab slidably disposed along the second locking mechanism assembly. The second locking tab is biased towards the distal end of the housing.

20 Claims, 8 Drawing Sheets

(56) References Cited

U.S. PATENT DOCUMENTS

| | | | |
|---|---|---|---|
| 5,052,775 | A | 10/1991 | Bossard et al. |
| 5,575,669 | A * | 11/1996 | Lin .................... G06K 13/0806 |
| | | | 439/157 |
| 6,607,308 | B2 | 8/2003 | Dair et al. |
| 6,758,600 | B2 | 7/2004 | Del Grosso et al. |
| 6,869,227 | B2 | 3/2005 | Del Grosso et al. |
| 7,376,322 | B2 | 5/2008 | Zimmel et al. |
| 7,416,349 | B2 | 8/2008 | Kramer |
| 7,873,253 | B2 | 1/2011 | Smrha et al. |
| 8,184,938 | B2 | 5/2012 | Cooke et al. |
| 8,286,325 | B2 | 10/2012 | Cooke et al. |
| 8,417,074 | B2 | 4/2013 | Nhep et al. |
| 8,452,148 | B2 | 5/2013 | Cooke et al. |
| 8,538,226 | B2 | 9/2013 | Makrides-Saravanos et al. |
| 8,712,206 | B2 | 4/2014 | Cooke et al. |
| 9,020,320 | B2 | 4/2015 | Cooke et al. |
| 10,120,153 | B2 | 11/2018 | Cooke et al. |
| 10,444,456 | B2 | 10/2019 | Cooke et al. |
| 2017/0343756 | A1 | 11/2017 | Hsu et al. |
| 2018/0259736 | A1 | 9/2018 | Hsu |
| 2019/0004268 | A1 | 1/2019 | Vogel |

OTHER PUBLICATIONS

Edge Hardware, Optical Communications, Corning Incorporated, https://www.corning.com/worldwide/en/products/communication-networks/products/fiber-optic-hardware/edge-hardware.html.
M7 UHD Fiber Enclosure Rack Mount, Model UC01U8-A, Legrand North America, LLC, https://www.legrand.us/ortronics/fiber/fiber-enclo sure- systems/rack-mount-fiber-cabinets/m7-uhd/uc0lu8-a.aspx.

* cited by examiner

EJECTABLE CASSETTE, GUIDE COLUMN, AND EJECTABLE CASSETTE SYSTEM

BACKGROUND

The datacenter industry is constantly moving towards higher bandwidth solutions to deal with the steady increase in devices that use data. One of the solutions to this problem has been to increase the fiber density in the data centers. Due to the standardization in rack sizes and the 1U, 2U and 4U footprints, space inside of the enclosures for fibers is generally at a premium. As such, the more fiber density is increased, the less space there is within the enclosure to accommodate the hands of a user manipulating the cassettes and patch cords during maintenance and/or installation.

The issue of reduced space within the enclosures has generally been addressed by mounting rows of cassettes onto pull-out trays. (See, e.g., Edge Hardware, Optical Communications, Corning Incorporated, https://www.corning. corning.com/worldwide/en/products/communication-networks/products/fiber-optic-hardware/edge-hardware.html; see also M7 UHD Fiber Enclosure Rack Mount, Model UC01U8-A, Legrand North America, LLC, https://www.legrand.us/ortronics/fiber/fiber-enclosure-systems/rack-mount-fiber-cabinets/m7-uhd/uc01u8-a.aspx). Depending on the size of the cassettes used, the pull-out trays allow a user to gain access to anywhere from two to six cassettes at a time for connecting fiber. A group of cassettes is therefore worked with at a time, resulting in interference from other cassettes and fibers. In addition, pull-out trays generally necessitate an increased depth of the enclosure itself. Instead of having the shallowest enclosure possible to save space in the rack, the depth of the enclosure is generally increased in an amount equal to the length of pull on the sliding tray. The amount of real estate inside the rack is thereby decreased, and the cost of each unit is increased by adding more material and parts to the enclosure in the form of slides, trays and their mounting hardware.

With traditional solutions, it can be more tedious to release cassettes from their locked and mounted position. In general, to release traditional cassettes, two fingers are placed on either side of the cassette to be able to press the release tab and slide out the cassette from the rack. Some enclosures may have enclosed backs with an access door that makes removing the cassette from the back difficult or impossible if the necessary feature was not added to the enclosure. This limits the amount of work that can be performed from the back of the enclosure. Access to fibers within enclosures can therefore be difficult with traditional cassettes.

SUMMARY

Exemplary embodiments of the present disclosure provide an ejectable cassette, a guide column, and an ejectable cassette system for efficiently installing and accessing fiber optic cables. The ejectable cassette includes locking mechanism assemblies with spring-loaded locking tabs for releasably interlocking the cassette with guide columns coupled to an enclosure. The locking mechanism assemblies are oriented in opposing directions on either side of the cassette, allowing the cassette to be inserted and ejected from the front or rear of the enclosure. The guide columns include a release lever capable of engaging the locking tabs of the cassette, and release tabs for ejecting the cassette from the front or rear of the enclosure.

In one exemplary embodiment, an ejectable cassette is provided. The ejectable cassette includes a housing including a proximal end, a distal end, a first side, and a second side. The ejectable cassette includes a first locking mechanism assembly at the first side of the housing. The first locking mechanism assembly includes a first locking tab slidably disposed along the first locking mechanism assembly (e.g., within a first channel). The first locking tab is biased towards the proximal end of the housing. The ejectable cassette includes a second locking mechanism assembly at the second side of the housing. The second locking mechanism assembly includes a second locking tab slidably disposed along the second locking mechanism assembly (e.g., within a second channel). The second locking tab is biased towards the distal end of the housing.

The first locking tab is slidably disposed within a first channel of the first locking mechanism assembly and is configured to engage with a latch of a first guide column. The second locking tab is slidably disposed within a second channel of the second locking mechanism assembly and is configured to engage with a latch of a second guide column. The first and second locking mechanism assemblies each include a hollow interior passage extending a partial length of the first and second locking mechanism assemblies. The first and second channels extend into the respective hollow interior passage.

The ejectable cassette includes a spring disposed within each hollow interior passage. The spring biases the respective first and second locking tabs in the opposing directions. The ejectable cassette includes a stop wall disposed within each hollow interior passage. One end of the spring is disposed against the stop wall and an opposing end of the spring is disposed against or around an end of the respective first and second locking tabs. In some embodiments, the first and second locking tabs each include a first end and a second end. The first end of the locking tabs is dimensioned greater in width than the second end, and a tapered section connects the first and second ends. The first end of the first and second locking tabs defines a flat surface for engagement with a corresponding latch of a guide column.

In one exemplary embodiment, a guide column is provided. The guide column includes, a central block, a first endpoint block, and a second endpoint block. The first endpoint block is aligned with the central block and is disposed adjacent to a top surface of the central block. The second endpoint block is aligned with the central block and the first endpoint block, and is disposed adjacent to a bottom surface of the central block. The guide column includes a first release lever disposed between the central block and the first endpoint block, and a second release lever disposed between the central block and the second endpoint block.

The central block includes a first pair of cassette rails extending from a first side of the central block, and a second pair of cassette rails extending from an opposing second side of the central block. The first and second pair of cassette rails extend parallel to each other and define a support slot between the respective cassette rails. The first endpoint block includes first and second single cassette rails extending from opposing sides of the first endpoint block, and the second endpoint block includes first and second single cassette rails extending from opposing sides of the second endpoint block. The first and second single cassette rails of the first endpoint block define a top surface of the guide column.

The first endpoint block includes a first engagement mechanism extending from a top surface of the first endpoint block, and the second endpoint block includes a complementary second engagement mechanism. The first engagement mechanism includes female mounting tabs with an opening extending therethrough. The second engagement mechanism includes male mounting tabs configured to snap into the female mounting tabs or female mounting tabs of an enclosure. For example, if two guide columns are vertically stacked, the male mounting tabs of the top guide column can be engaged with the female mounting tabs of the bottom guide column to interlock the two guide columns together. The first and second release levers each include first and second latches on opposing sides of an elongated extension. The first and second release levers each include first and second release tabs on opposing ends of an elongated extension.

In one exemplary embodiment, an ejectable cassette system is provided. The ejectable cassette system includes first and second guide columns, and an ejectable cassette. Each of the first and second guide columns includes a central block, a first endpoint block aligned with the central block, a second endpoint block aligned with the central block and the first endpoint block, a first release lever disposed between the central block and the first endpoint block, and a second release lever disposed between the central block and the second endpoint block. The ejectable cassette includes a housing including a proximal end, a distal end, a first side, and a second side.

The ejectable cassette includes a first locking mechanism assembly at the first side of the housing. The first locking mechanism assembly includes a first locking tab slidably disposed along the first locking mechanism assembly. The first locking tab is biased towards the proximal end of the housing. The ejectable cassette includes a second locking mechanism assembly at the second side of the housing. The second locking mechanism assembly includes a second locking tab slidably disposed along the second locking mechanism assembly. The second locking tab is biased towards the distal end of the housing. The first release lever and the second release lever of each of the first and second guide columns include a latch, and the first locking tab and the second locking tab of the ejectable cassette are configured to engage with the respective latch of the first and second release levers to releasably interlock the ejectable cassette with the first and second guide columns.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the ejectable cassettes, guide columns, and ejectable cassette systems, reference is made to the accompanying figures, wherein.

DETAILED DESCRIPTION

Exemplary embodiments of the present disclosure provide an ejectable cassette, a guide column, and an ejectable cassette system for efficiently installing and accessing fiber optic cables. The ejectable cassette includes locking mechanism assemblies with spring-loaded locking tabs for releasably interlocking the cassette with guide columns coupled to an enclosure. The locking mechanism assemblies are oriented in opposing directions on either side of the cassette, allowing the cassette to be inserted and ejected from the front or rear of the enclosure. The guide columns include a release lever capable of engaging the locking tabs of the cassette, and release tabs for ejecting the cassette from the front or rear of the enclosure. The guide columns can be stacked relative to each other to accommodate different groups of cassettes, and are reversible such that the guide columns can be installed in any orientation.

Figure 1:
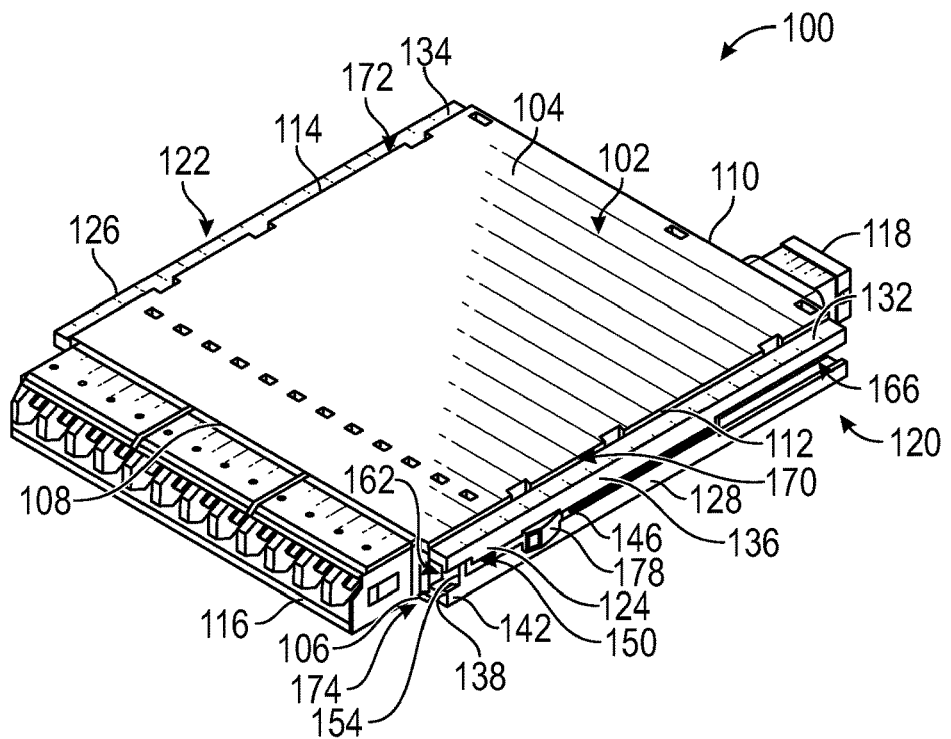
FIG. 1 is a front perspective view of an ejectable cassette in an exemplary embodiment.
Figure 2:
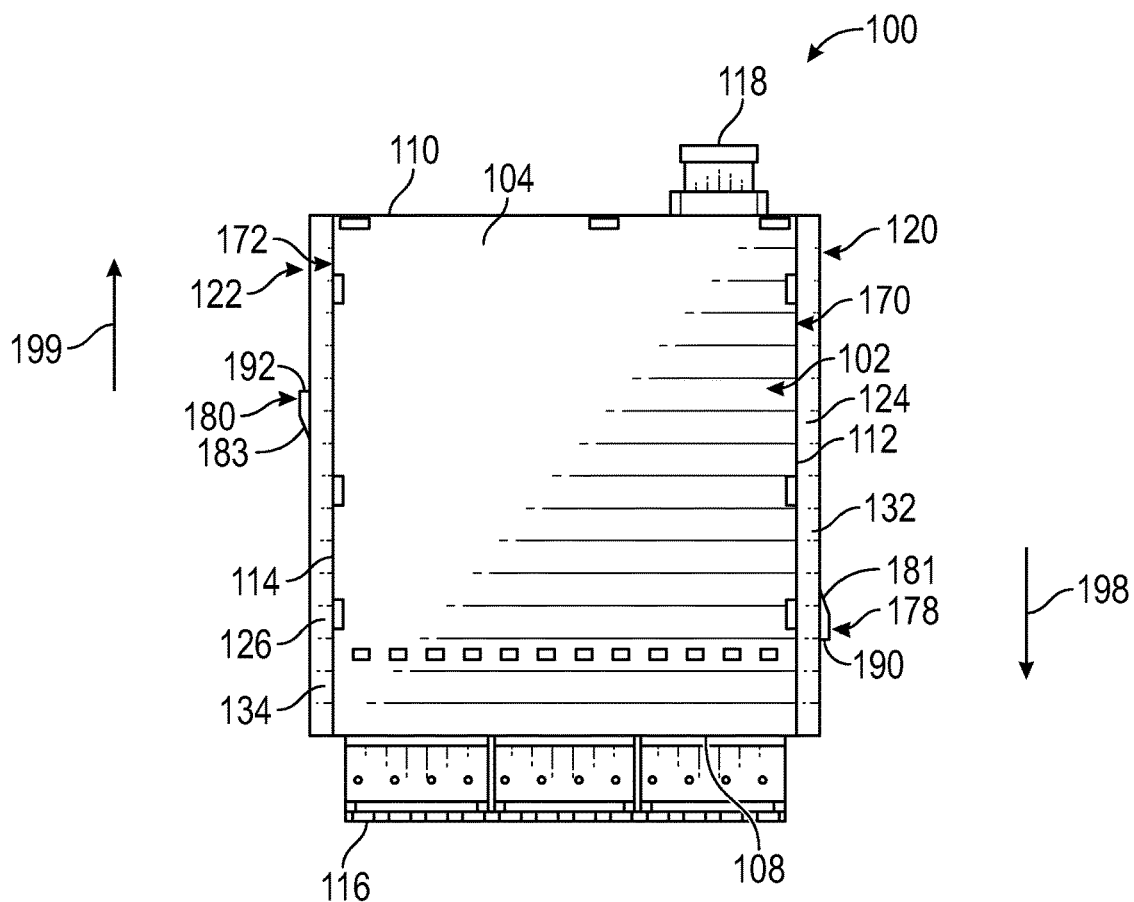
FIG. 2 is a top view of an ejectable cassette in an exemplary embodiment.
Figure 3:
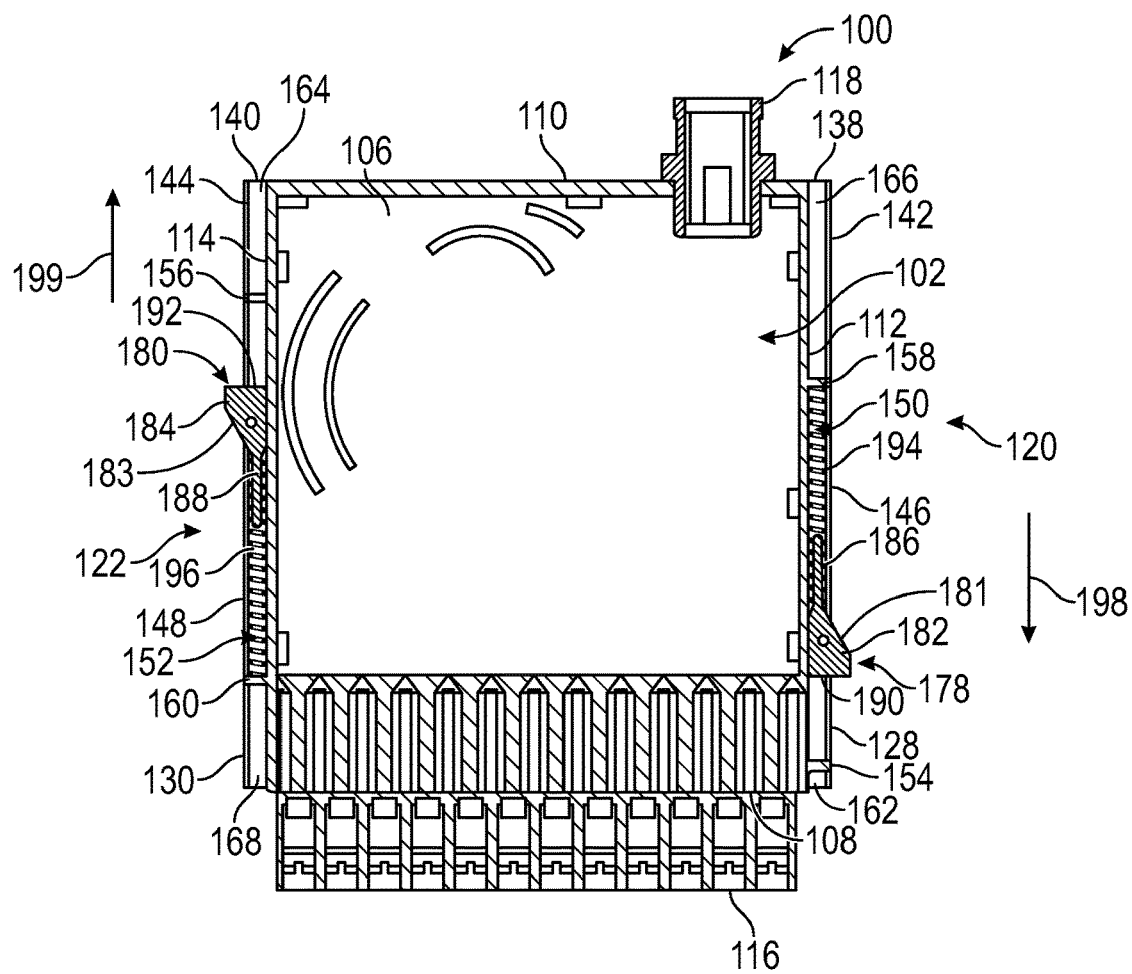
FIG. 3 is a top cross-sectional view of an ejectable cassette in an exemplary embodiment.

FIGS. 1-3 are front perspective, top and cross-sectional views of an exemplary ejectable cassette (hereinafter "cassette 100") of the present disclosure. The cassette 100 includes a housing 102 formed by a cover 104 (e.g., defining a top surface) and a base 106 (e.g., defining a bottom surface). The cover 104 and base 106 are coupled together to encase the internal electrical components of the cassette 100. The cassette 100 includes a front or proximal end 108, a rear or distal end 110, and opposing first and second sides 112, 114. The distance between the proximal and distal ends 108, 110 can define the length of the cassette 100, the distance between the sides 112, 114 can define the width of the cassette 100, and the distance between the cover 104 and base 106 can define the height of the cassette 100. The proximal end 108 includes one or more fiber and/or electrical connections 116 (e.g., LC type, sockets, or the like) capable of optically and/or electrically coupling with one or more corresponding fiber connectors. The distal end 110 includes one or more fiber and/or electrical modules 118 capable of receiving and optically/electrically coupling one or more cables to the cassette 100.

The cassette 100 includes a first locking mechanism assembly 120 coupled to the side 112, and a second locking mechanism assembly 122 coupled to the side 114. In some embodiments, the assemblies 120, 122 can be fabricated as separate components from the housing 102 and are coupled or attached to the housing 102 with, e.g., fasteners. In some embodiments, the assemblies 120, 122 can be fabricated as part of the housing 102. For example, a top section of the assemblies 120, 122 can be fabricated as part of the cover 104, and a bottom section of the assemblies 120, 122 can be fabricated as part of the base 106. As described below, the assemblies 120, 122 provide a spring-loaded mechanism for interlocking the cassette with an enclosure in a releasable manner, such that the cassette can be selectively ejected from the enclosure for installation and/or maintenance.

The assemblies 120, 122 can be equal or substantially equal in length to the length of the cassette 100. Each of the assemblies 120, 122 includes a top or first section 124, 126 and a bottom or second section 128, 130, each extending the length of the cassette 100. The overall height of the assemblies 120, 122 can be dimensioned slightly smaller than the height of the cassette 100, thereby forming a step 170, 172, 174, 176 at cover 104 and base 106 (see, e.g., FIG. 1 and FIG. 14). The first sections 124, 126 include a first wall 132, 134 extending perpendicularly or substantially perpendicularly from the respective sides 112, 114 (offset vertically from the cover 104 to form steps 170, 174), and a second wall 136 (not visible for first section 126) extending perpendicularly or substantially perpendicularly to the first wall 132, 134 and parallel or substantially parallel to the respective sides 112, 114.

The second sections 128, 130 include a first wall 138, 140 extending perpendicularly or substantially perpendicularly from the respective sides 112, 114 (offset vertically from the base 106 to form steps 172, 176), and a second wall 142, 144 extending perpendicularly or substantially perpendicularly to the first wall 138, 140 and parallel or substantially parallel to the respective sides 112, 114. The second walls 136 of the first sections 124, 126 and the second walls 142, 144 of the second sections 128, 130 face each other in a spaced manner, forming an elongated channel 146, 148 therebetween. The channels 146, 148 extend a portion of the length between the proximal and distal ends 108, 110.

The channels 146, 148 extend into a hollow interior passage 150, 152 formed within the assemblies 120, 122 between the first and second sections 124-130. Although the assemblies 120, 122 are structurally the same, the orientation of the assemblies 120, 122 is in opposite directions (e.g., a mirror image). The assembly 120 includes a first stop wall 154 (e.g., a vertical inner wall) offset from the proximal end 108 and extending perpendicularly from the first wall 142 towards the first wall 132, and the assembly 122 includes a first stop wall 156 offset from the distal end 110 and extending perpendicularly from the first wall 142 towards the first wall 134.

The assembly 120 includes a second stop wall 158 (e.g., a vertical inner wall) offset from the distal end 110 and extending perpendicularly from the first wall 142 towards the first wall 132, and the assembly 122 includes a second stop wall 160 offset from the proximal end 108 and extending perpendicularly from the first wall 142 towards the first wall 134. In some embodiments, the second stop walls 158, 160 can be offset further away from the respective distal and proximal ends 110, 108 than the offset distance of the first stop walls 154, 156. In some embodiments, the offset distance of the first and second stop walls 154-160 from the respective proximal and distal ends 108, 110 can be substantially equal. In some embodiments, the distance of the first stop wall 154 from the proximal end 108 can be greater than the distance of the first stop wall 156 from the distal end 110. In some embodiments, the distance of the second stop wall 158 from the distal end 110 can be greater than the distance of the second stop wall 160 from the proximal end 108. In some embodiments, the position of the stop walls 154-160 can be substantially similar, with the operation and scale of action of the assemblies 120, 122 substantially equal in each direction.

The channels 146, 148 extend between the respective first and second stop walls 154-160. The assemblies 120, 122 can include hollow grooves 162, 164, 166, 168 extending from the proximal and distal ends 108, 110 towards the respective first and second stop walls 154-160. The assemblies 120, 122 include a locking tab 178, 180 slidably disposed within the channel 146, 148. The locking tabs 178, 180 include opposing ends 182, 184, 186, 188, with the ends 182, 184 dimensioned greater in width than the ends 186, 188. The locking tab 178, 180 body tapers from the ends 182, 184 to the ends 186, 188 at the tapered sections 181, 183.

The ends 182, 184 are partially disposed within the hollow interior passage 150, 152 and extend out of the hollow interior passage 150, 152 through the channel 146, 148, thereby extending beyond the outer side walls of the assemblies 120, 122. The inner surfaces of the assemblies 120, 122 maintain the locking tab 178, 180 within the hollow interior passage 150, 152 such that the locking tab 178, 180 can slide within and along the channel 146, 148 (e.g., the locking tab 178, 180 is trapped between the cover 104 and base 102 to ride in the channel 146, 148). The ends 182, 184 each have a flat surface 190, 192 defining the endpoint of the locking tab 178, 180. In some embodiments, the ends 186, 188 can be circular or cylindrical in configuration.

The assemblies 120, 122 include a compression spring 194, 196 disposed within the hollow interior passage 150, 152. One end of the spring 194, 196 is disposed against the stop wall 158, 160 and the opposing end of the spring 194, 196 fits around the end 186, 188 of the locking tab 178, 180. The spring 194, 196 maintains a predetermined position of the locking tab 178, 180 along the length of the channel 146, 148. The locking tabs 178, 180 can be slid along the respective channels 146, 148 in opposite directions 198, 199 to compress the springs 194, 196. The spring-loaded locking tabs 178, 180 are biased into the position shown in FIGS. 1-3 when the force on the locking tabs 178, 180 is released.

The opposing directions of the assemblies 120, 122 results in the locking tab 178 being biased forward towards the proximal end 108, and the locking tab 180 being biased rearward towards the distal end 110. The opposing bias directions of the locking tabs 178, 180 allows the locking tabs 178, 180 to center the cassette 100 relative to an enclosure in a locked position of the cassette 100. The assemblies 120, 122 can be symmetrical about a central vertical axis passing through the cover 104 and base 106, and allows the cassette 100 to be inserted into the enclosure from both the front and the rear (e.g., the cassette 100 can be rotated 180° about the central vertical axis to provide the same configuration). When the cassette 100 is released from its locking position relative to the enclosure, the spring-loaded locking tabs 178, 180 eject the cassette 100 either to the front or the rear of the enclosure depending on which locking tab 178, 180 is released.

Figure 4:
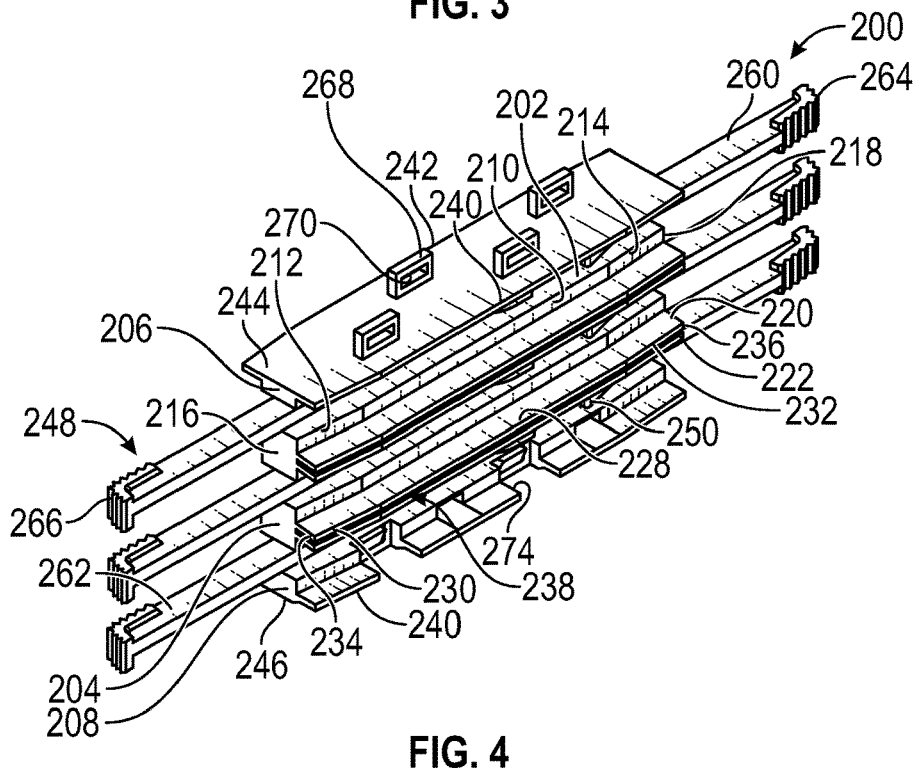
FIG. 4 is a perspective view of a guide column of an ejectable cassette system in an exemplary embodiment.
Figure 5:
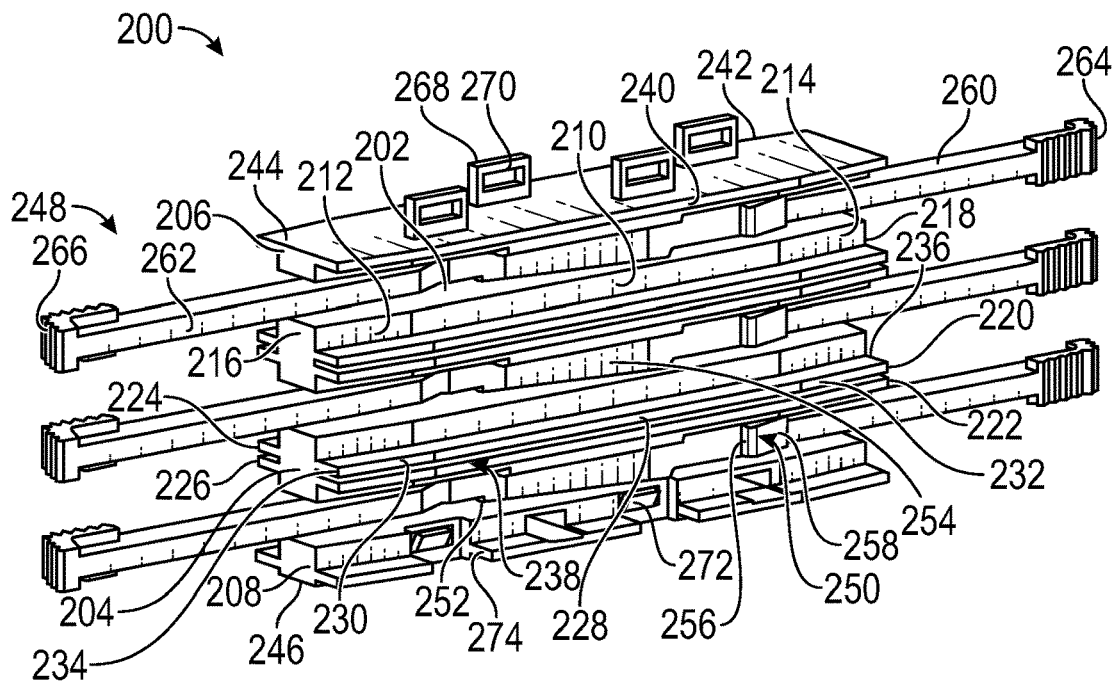
FIG. 5 is a perspective view of a guide column of an ejectable cassette system prior to engagement in an exemplary embodiment.

FIGS. 4 and 5 are perspective views of an exemplary guide column 200 of the present disclosure. The guide columns 200 can be coupled in pairs to an enclosure to hold groups of cassettes 100 on opposing sides of the respective cassettes 100. In some embodiment, two guide columns 200 disposed on opposing sides of the enclosure can hold three cassettes 100. In some embodiments, the guide columns 200 can be designed to hold more or less than three cassettes 100. The guide columns 200 can be configured to fit into a 1U enclosure space. For example, the guide columns 200 can be stacked on top of each other and detachably snapped or interlocked together to fit into a 2U and 4U enclosure space. In a 2U enclosure space, two guide columns 200 can be stacked on top of each other. In a 4U enclosure, four guide columns 200 can be stacked on top of each other.

The guide column 200 includes two central blocks 202, 204 (e.g., at least one central block) and two endpoint blocks 206, 208, each aligned along a central vertical plane extending along the length of the guide column 200. The endpoint blocks 206, 208 are disposed on opposing sides of the guide column 200. In some embodiments, each side of the central blocks 202, 204 includes a central section 210 with planar, parallel opposing surfaces, and end sections 212, 214 tapering to narrower, planar end surfaces 216, 218. In some embodiments, the endpoint blocks 206, 208 can define a similar configuration.

Each central block 202, 204 includes a pair of cassette rails 220, 222, 224, 226 extending in a parallel orientation on opposing sides of the central block 202, 204. In some embodiments, each configuration of the rails 220-226 can be similar to the configuration of the sides of the central blocks 202, 204, e.g., a central section 228 with a planar surface parallel to the central section 228 of the opposing rail, and end sections 230, 232 tapering to narrower, planar end surfaces 234, 236. The end surfaces 234, 236 can be aligned with the end surfaces 216, 218 of the central blocks 202, 204. Each pair of cassette rails 220-226 forms a support slot 238 between the respective rails 220-226. The slot 238 extends the entire length of the rails 220-226.

Each endpoint block 206, 208 includes a single cassette rail 240, 242 extending along the same plane on opposing sides of the endpoint block 206, 208. The side surfaces of the cassette rails 240, 242 can be substantially similar to the side surfaces of the cassette rails 220-226. The cassette rails 240, 242 of the endpoint block 206 can together form a planar top surface 244 of the guide column 200, e.g., the cassette rails 240, 242 connect to each other at the top surface 244 without having stepped surfaces in-between the cassette rails 240, 242. The endpoint block 208 can include a protrusion 246 (e.g., a bottom surface of the guide column 200) extending along the central plane and forming steps on either side of the guide column 200, the steps and endpoint block 208 separating the cassette rails 240, 242 of the endpoint block 208. The height of the protrusion 246 can be dimensioned substantially similar to the height of the support slot 238, such that when two guide columns 200 are stacked on top of each other with the protrusion 246 of one guide column 200 disposed against the top surface 244 of a second guide column 200, the cassette rails 240, 242 of the endpoint blocks 206, 208 form a pair of rails 240, 242 with a support slot therebetween.

The guide column 200 includes elongated release levers 248. The release levers 248 can be disposed between the central blocks 202, 204, between the central block 202 and the endpoint block 206, and between the central block 204 and the endpoint block 208. The release levers 248 can be symmetrical about a central vertical axis (e.g., the guide block 100 can be rotated 180° about the central vertical axis to provide the same configuration). Each side of the release lever 248 includes a latch 250, 252 with an inwardly curved central section 254 on opposing sides of the release lever 248. Each latch 250, 252 includes an inner planar engagement surface 256 and a tapered outer surface 258. Each side of the lever 248 includes an elongated extension 260, 262 extending outwardly from the latch 250, 252, and a release tab 264, 266 facing in opposing side directions. The release tabs 264, 266 can include multiple grooves or gradations to provide a textured surface for gripping the release tabs 264, 266 by the user. The elongated configuration of the release levers 248 creates a fulcrum-type mechanism for engagement and release of the cassette 100.

The top surface 244 of the guide column 200 includes female mounting tabs 268 (e.g., upper mounting tabs, first engagement mechanism) protruding upwardly from the top surface 244. Each mounting tab 268 can include a central opening 270 configured to receive and engage with a corresponding male mounting tab 272 (e.g., second engagement mechanism) extending from the endpoint block 208. In some embodiments, the guide column 200 can include four female mounting tabs 268 staggered relative to each other (e.g., symmetrical about a central vertical axis). For example, two female mounting tabs 268 can be aligned with each other near the outer surface of the cassette rail 240, and two female mounting tabs 268 can be aligned with each other near the outer surface of the cassette rail 242.

The endpoint block 208 includes two male mounting tabs 272 (e.g., lower mounting tabs) facing in one side direction at cutouts 274 in the cassette rail 240, and two male mounting tabs 272 facing in the opposing side direction at the cutouts (not visible) in the cassette rail 242. The opposing male mounting tabs 272 can be staggered, with one every other male mounting tab 272 facing in the opposing direction. The male mounting tabs 272 each define a protrusion with a tapered configuration configured to slide and snap into the opening 270 of the corresponding female mounting tab 268. The symmetry of at least some of the components of the guide column 200 about a central vertical axis allow for the guide column 200 to be rotated/flipped and used in any orientation (e.g., forward, backwards, or the like) to ease installation.

Figure 6:
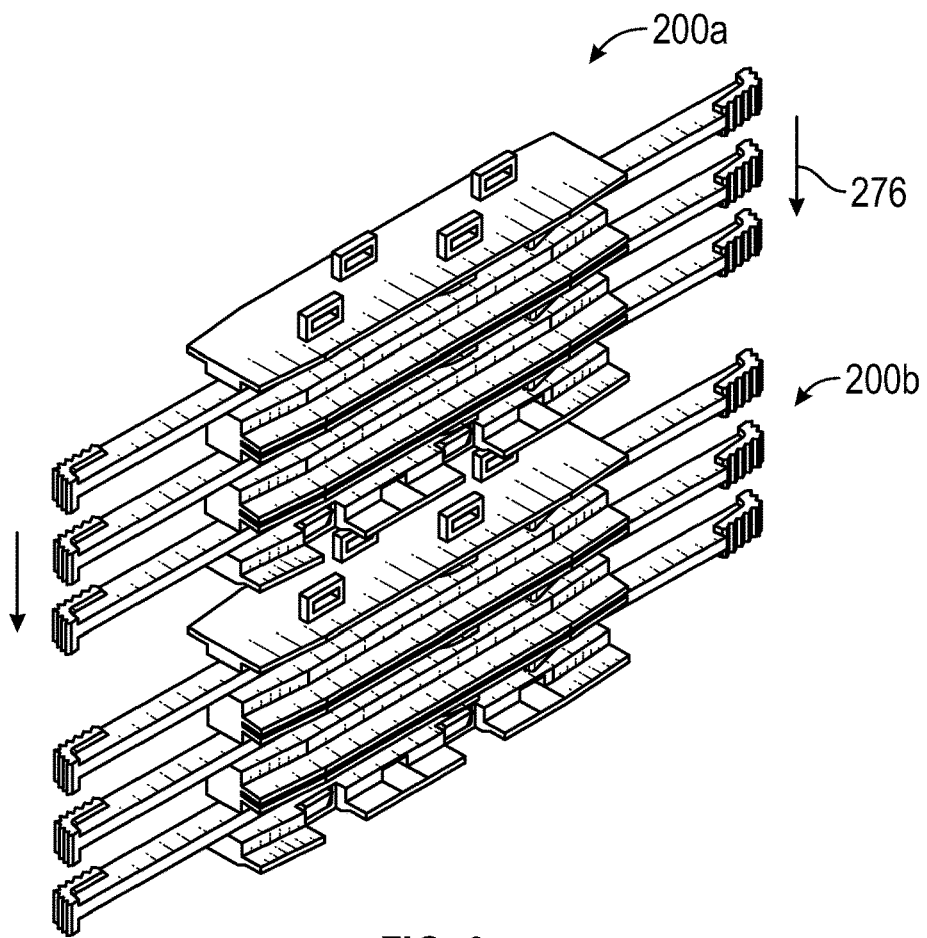
FIG. 6 is a perspective view of two guide columns of an ejectable cassette system prior to engagement with each other in an exemplary embodiment.
Figure 7:
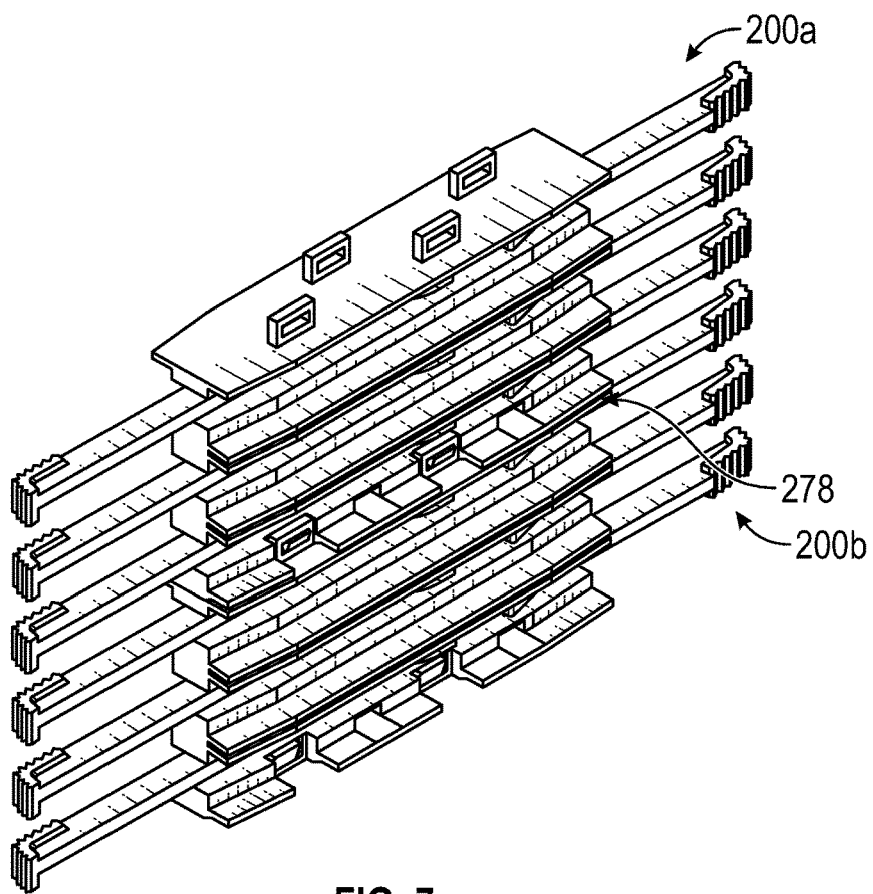
FIG. 7 is a perspective view of two guide columns of an ejectable cassette system engaged with each other in an exemplary embodiment.

FIG. 6 is a perspective view of two guide columns 200a, 200b prior to engagement or interlocking with each other, and FIG. 7 is a perspective view of the two guide columns 200a, 200b engaged or interlocked with each other in a stacked orientation. The male mounting tabs 272 of a first or upper guide column 200a are designed to snap into the female mounting tabs 268 of a second or lower guide column 200b stacked below the guide column 200a such that the guide columns 200a, 200b can be stacked and detachably interlocked relative to each other to accommodate a greater number of cassettes 100. The respective female mounting tabs 268 can be aligned with the male mounting tab 272 as shown in FIG. 6, and a downward force 276 is applied on the guide column 200a. The force 276 flexes the female mounting tabs 268, the male mounting tabs 272, or both, to allow the male mounting tabs 272 to snap into the opening 270 in the respective female mounting tabs 268, thereby interlocking the guide columns 200a, 200b together. As illustrated in FIG. 7, the cassette rails 240, 242 of the endpoint block 208 of the guide column 200a are disposed adjacent (yet spaced) from the cassette rails 240, 242 of the endpoint block 206 of the guide column 200b to form a support slot 278 therebetween.

Figure 8:
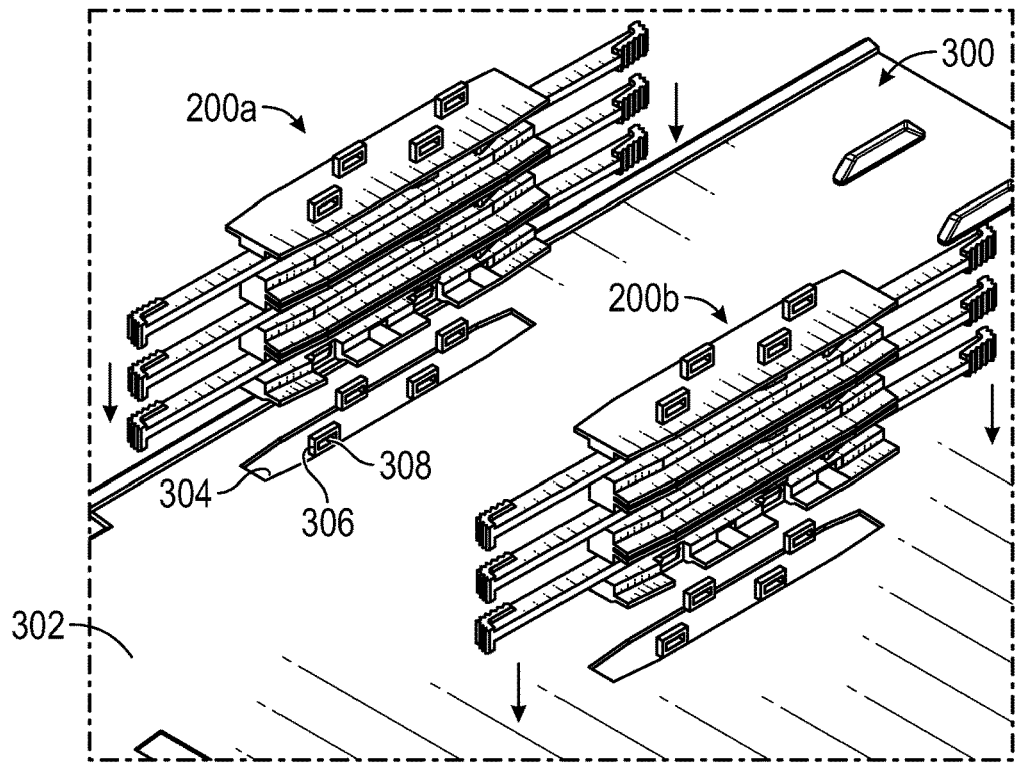
FIG. 8 is a perspective view of guide columns of an ejectable cassette system prior to engagement with an enclosure in an exemplary embodiment.
Figure 9:
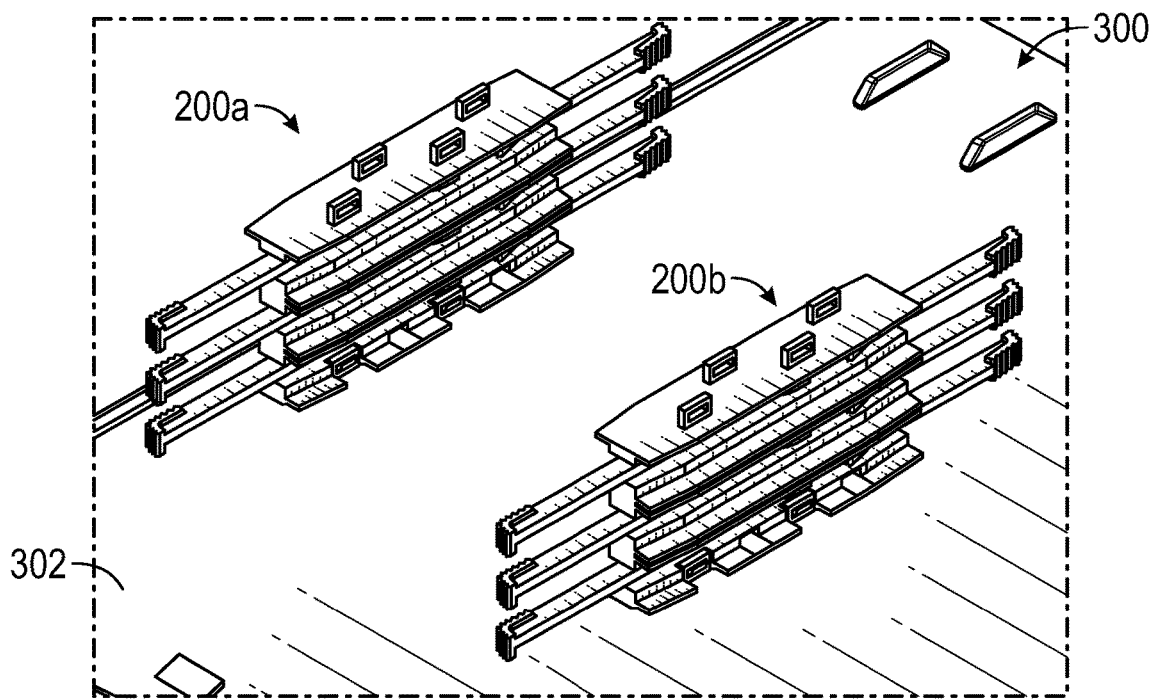
FIG. 9 is a perspective view of guide columns of an ejectable cassette system engaged with an enclosure in an exemplary embodiment.

FIG. 8 is a perspective view of guide columns 200a, 200b prior to engagement or interlocking with an enclosure 300, and FIG. 9 is a perspective view of guide columns 200a, 200b after engagement or interlocking with the enclosure 300 (e.g., an ejectable cassette system). The enclosure 300 includes a base 302 (and/or a top cover) with an inner surface having female mounting tabs 306 extending from the base 302. The female mounting tabs 306 can be substantially similar to the female mounting tabs 268 of the guide column 200a, 200b, including openings 308 for receiving and engaging/snapping with the male mounting tabs 272 of the guide column 200a, 200b to interlock the guide column 200a, 200b to the base 302. In some embodiments, the female mounting tabs 306 can be molded into the base 302 if the base 302 is fabricated from plastic. In some embodiments, the female mounting tabs 306 can be formed from sheet metal bent up from the base 302 (for an enclosure 300 fabricated from sheet metal).

In some embodiments, the base 302 can include a recessed area 304 surrounding the female mounting tabs 306. The depth of the recessed area 304 can be dimensioned substantially equal to the height of the protrusion 246 of the endpoint block 208 of the guide column 200a, 200b. Engagement of the guide column 200a, 200b with the enclosure 300 results in the protrusion 246 disposed entirely within the recessed area 304 and the cassette rails 240, 242 of the endpoint block 208 disposed against the surface of the base 302.

Figure 10:
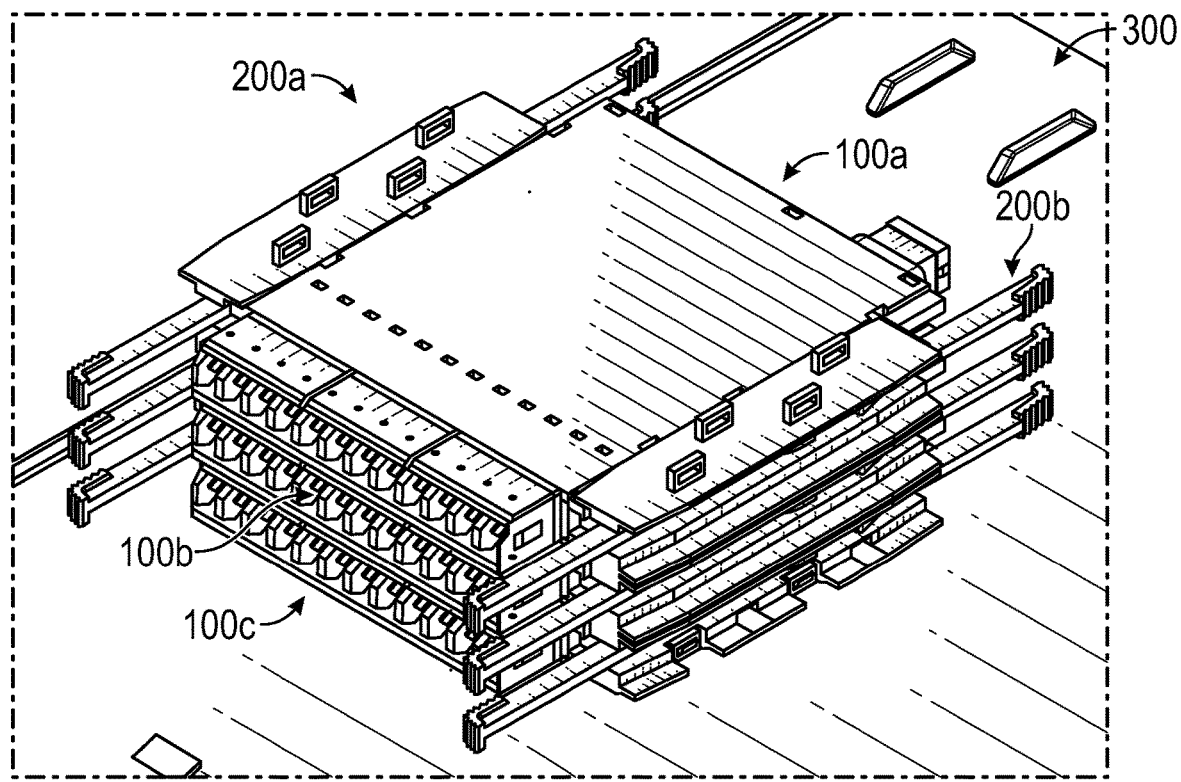
FIG. 10 is a perspective view of guide columns of an ejectable cassette system engaged with an enclosure and three ejectable cassettes engaged with the guide columns in an exemplary embodiment.

FIG. 10 is a perspective view of guide columns 200a, 200b interlocked with the enclosure 300, and three cassettes 100a-c releasably engaged with the guide columns 200a, 200b. The space or distance between the cassette rails of the guide columns 200a, 200b provides a passage for insertion and sliding of the respective cassettes 100a-c. For example, the space or distance between the cassette rail 240 of the endpoint block 206 and the cassette rail 220 of the central block 202 is configured to slidably receive the cassette 100a, the space or distance between the cassette rail 222 of the central block 202 and the cassette rail 220 of the central block 204 is configured to slidably receive the cassette 100b, and the space or distance between the cassette rail 222 of the central block 204 and the cassette rail 240 of the endpoint block 208 is configured to slidably receive the cassette 100c.

Figure 11:
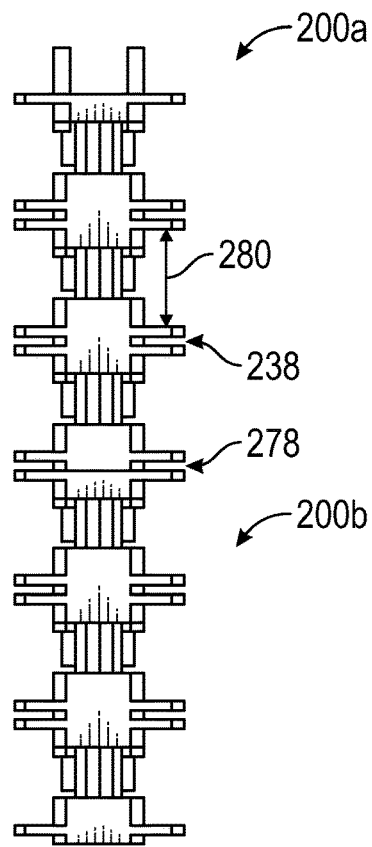
FIG. 11 is a front view of two guide columns of an ejectable cassette system engaged with each other in an exemplary embodiment.

FIG. 11 is a front view of guide columns 200a, 200b stacked on top of each other and interlocked together in a vertical orientation. Distance 280 represents the space configured to slidably receive a cassette 100 (e.g., cassette grooves or passages). The assembly of the guide columns 200a, 200b includes the support slots 238 formed between the cassette rails 220, 222, and the support slots 278 formed between the support slots 240, 242 of the adjacently positioned guide columns 200a, 200b. The support slots 238, 278 can be molded into the guide columns 200a, 200b to increase the overall rigidity of the guide columns 200a, 200b. In some embodiments, the guide columns 200a, 200b may be fabricated or molded from plastic, stamped or formed from metal, combinations thereof, or the like. In some embodiments, the guide columns 200a, 200b may have a flex in them. The flex of the guide columns 200a, 200b can increase when the guide columns 200a, 200b are stacked two or four high for 2U and 4U enclosures.

Figure 12:
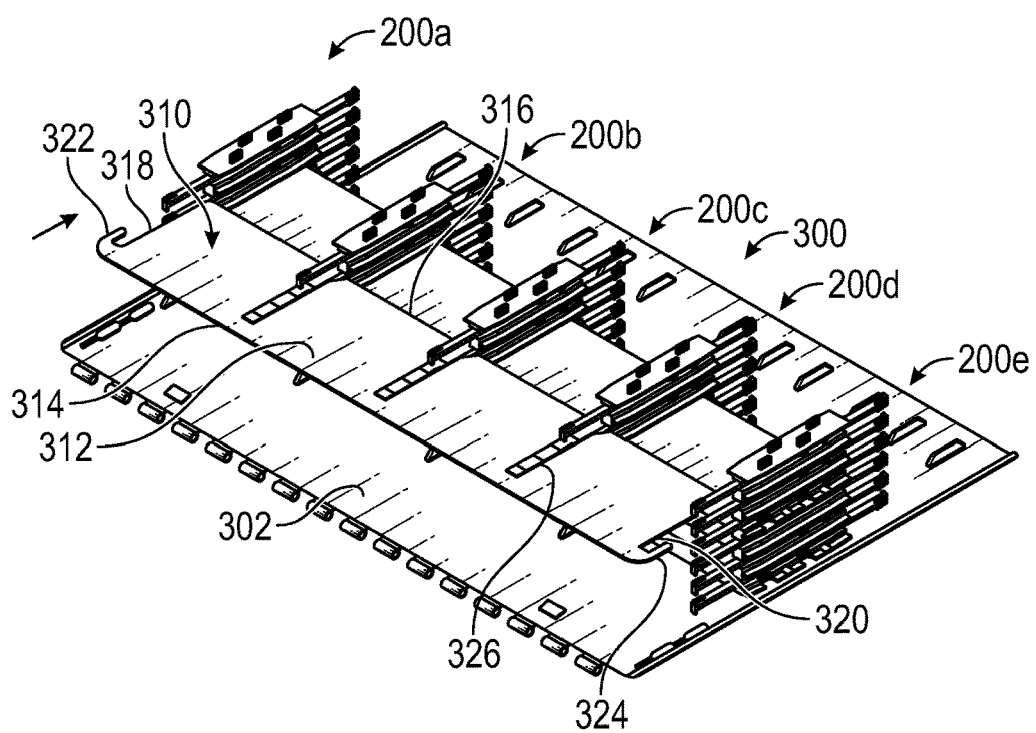
FIG. 12 is a perspective view of guide columns of an ejectable cassette system engaged with an enclosure and support sheets engaged with the guide columns in an exemplary embodiment.

In order to increase the rigidity of the assembly, as illustrated in FIG. 12, the support slots 238, 278 can each slidably receive a thin, rigid support sheet 310. In some embodiments, the support sheet 310 can be formed from, e.g., a metal, a composite, a suitably strong engineering plastic, combinations thereof, or the like. FIG. 12 shows multiple guide columns 200a-e (each formed from two stacked and interlocked guide columns 200) engaged with an enclosure 300. The support sheets 310 can include a planar body 312 with a front edge 314, a rear edge 316, and opposing side edges 318, 320. The front and rear edge 314, 316 can be planar or linear and parallel to each other. The side edges 318, 320 can be substantially planar or linear and parallel to each other. The support sheet 310 is symmetrical to allow for the support sheet 310 to be inserted either from the front or the rear of the guide columns 200a-e. The symmetrical configuration of the support sheet 310 also allows the support sheet 310 to be inserted either face up or face down during engagement with the guide columns 200a-e.

The body 312 includes slots 326 formed in and partially extending into the body 312 from the rear edge 316 towards the front edge 316 (e.g., more than halfway to the front edge 316). The slots 326 can be spaced from each other and aligned to correspond with the position of the guide columns 200b-d such that during engagement with the guide columns 200a-e, the slots 326 can receive the respective blocks 202-208 while sliding into the support slots 238, 278. The side edges 318, 320 include hook-like protrusions 322, 324 extending from the front edge 314 and towards the rear edge 316. The hook-like protrusions 322, 324 receive and wrap around the respective blocks 202-208 while sliding into the support slots 238, 278. Engagement of the support sheets 310 with the guide columns 200a-e ties all of the guide columns 200a-e in a row, resulting in a rigid "as one" assembly or unit. However, it should be understood that the guide columns 200a-e can be used with or without the support sheets 310.

Figure 13:
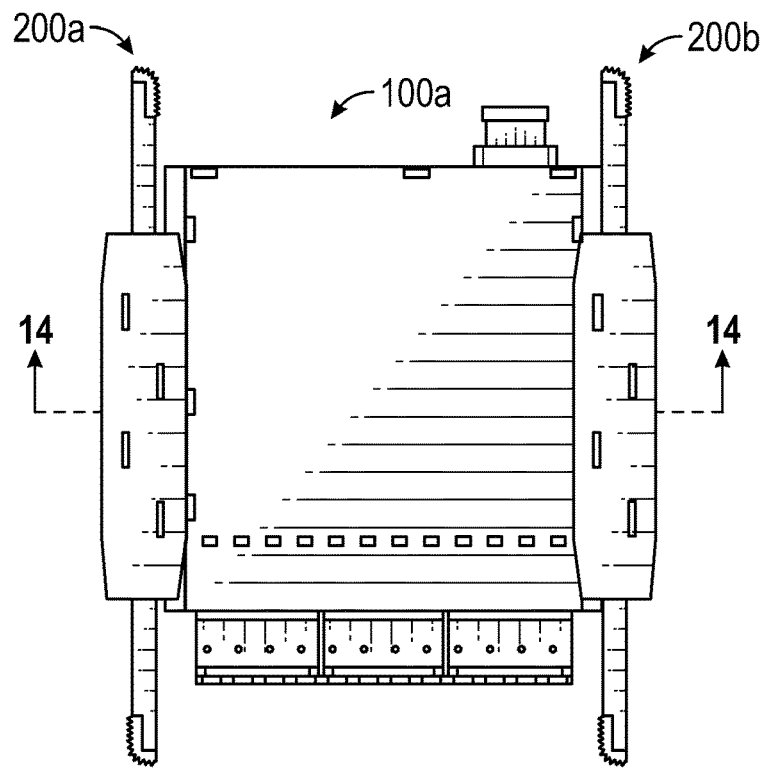
FIG. 13 is a top view of guide columns engaged with ejectable cassettes in an exemplary embodiment.
Figure 14:
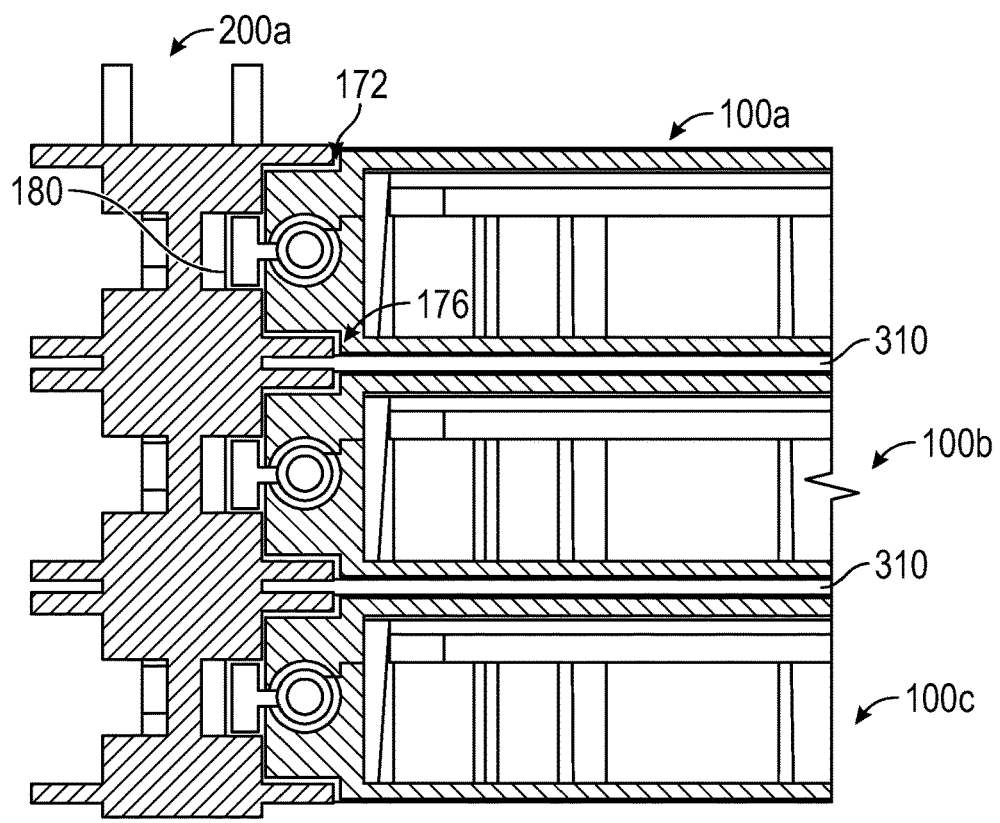
FIG. 14 is a partial cross-sectional view of FIG. 13 with guide columns engaged with ejectable cassettes in an exemplary embodiment.

FIG. 13 is a top view of guide columns 200a, 200b engaged with ejectable cassettes 100a-c, and FIG. 14 is a partial cross-sectional view of FIG. 13. The cassette rails of the guide columns 200a, 200b and the distance 280 between the cassette rails is configured to follow the outer shape of the body of the cassette 100a-c. The configuration of the guide columns 200a, 200b creates pockets or passages for the cassettes 100a-c to fit into when mounted properly to the enclosure 300. As noted above, mounting of the cassettes 100a-c to the guide columns 200a, 200b can be performed with or without the support sheets 310.

The cassette rails of the guide columns 200a, 200b extend almost the full length of the cassette 100a-c to provide support across the length of the cassette 100a-c. Such support provides a smooth surface for the cassette 100a-c to be inserted or ejected along with little or no resistance. The length of the cassette rails also counteracts the torque created by the opposing spring forces of the locking mechanism assemblies 120, 122 of the cassette 100a-c that bias the cassette 100a-c in a twisting-type motion in its final mounted position. As shown in FIG. 14, the locking tab 180 slides or rides against the respective release lever 248 for engagement.

Figure 15:
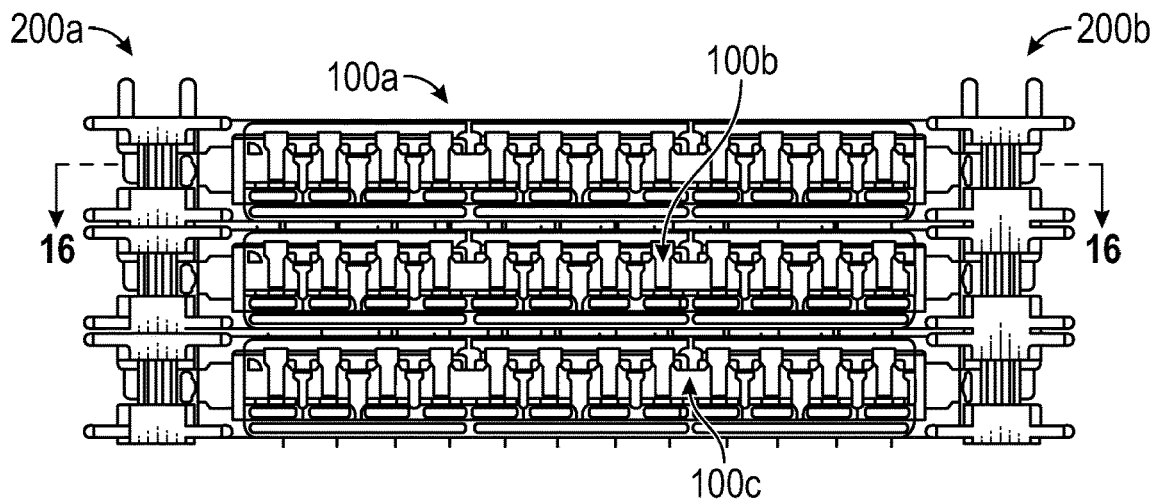
FIG. 15 is a side view of guide columns engaged with ejectable cassettes in an exemplary embodiment.
Figure 16:
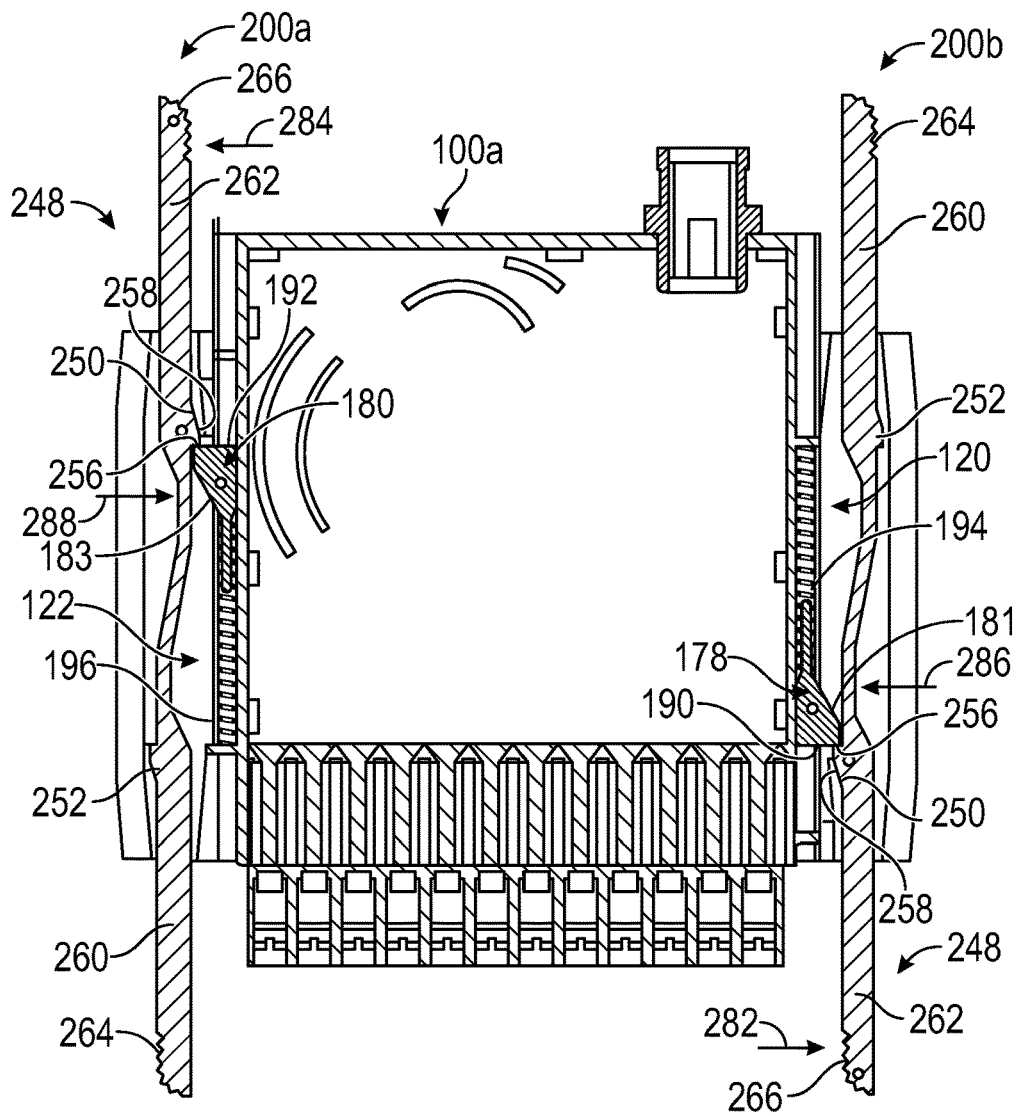
FIG. 16 is a top cross-sectional view of guide columns engaged with ejectable cassettes in an exemplary embodiment.

FIG. 15 is a side view of guide columns 200a, 200b engaged with the cassettes 100a-c, and FIG. 16 is a top cross-sectional view of FIG. 15. For each cassette 100a-c, the respective guide columns 200a, 200b include two active release tabs 266 (e.g., a front right tab 266 and a rear left tab 266). Arrow 282 represents a user finger applying a force pressing on the release tab 266 to release the cassette 100*a* in a forward or front direction, and arrow 284 represents a user finger applying a force pressing on the release tab 266 to release the cassette 100*a* in a rearward or rear direction. The arrows 286, 288 show the axis or pivot point about which the release lever 248 bends during application of the respective force on the tabs 266 to disengage and release the cassette 100*a*.

When the cassette 100*a* is inserted from the front (e.g., the bottommost area in FIG. 16), the locking tab 180 on the back left of the cassette 100*a* catches the latch 250 on the back left of the guide column 200*a*. In particular, the surface 192 engages with the surface 256. As the cassette 100*a* is pushed further in a rearward direction (a lock position), the spring 196 of the locking mechanism assembly 122 compresses and the sloped or tapered section 181 of the locking tab 178 slides over the latch 250 and moves or biases the latch 250 out of the way (due to the flexibility of the release lever 248).

Once the locking tab 178 passes the latch 250, the release lever 248 (and the latch 250) snaps back into place, engaging the surfaces 190, 256 against each other and locking the cassette 100*a* in place. The spring 194 biases the surface 190 against surface 256, ensuring engagement between the locking tab 178 and the guide column 200*b*. When the hand or finger(s) of the user is removed from the front of the cassette 100*a*, the cassette 100*a* can shift slightly forward as the opposing spring 194, 196 biasing forces on either side of the cassette 100*a* balance themselves out. Although described for insertion of the cassette 100*a* from the front, it should be understood that insertion of the cassette 100*a* from the rear would be performed in a substantially similar manner, except for a reversed operation of the latches 250 and locking tabs 178, 180.

To eject the cassette 100*a* toward the front, one or more fingers of the user can be used to press outward in direction 282 on the release tab 266. Application of a force on the release tab 266 causes the release tab 266 and release lever 248 to pivot or rotate about the axis or point 286, resulting in the latch 250 moving outwardly and disengaging from the locking tab 178 (the surfaces 190, 256 are disengaged). Upon disengagement of the latch 250 from the locking tab 178, the spring 194 biases the locking tab 178 forward beyond the latch 250 and the spring 196 force of the surface 192 against surface 256 pushes the cassette 100*a* out toward the front. Once the cassette 100*a* is pushed forward at least partially beyond the guide columns 200*a*, 200*b* and away from the other cassettes 100*b*, 100*c*, clear space is provided to grab the cassette 100*a* and/or any fibers for manipulation. Although described for ejection of the cassette 100*a* from the front, it should be understood that ejection of the cassette 100*a* from the rear would be performed in a substantially similar manner, except for application of a force on the release tab 266 in direction 284 and reversed operation of the latches 250 and locking tabs 178, 180.

Fiber density in enclosures is increasing with the demand for connectivity in our day-to-day lives, and such fiber density and demand will only continue to increase. The exemplary ejectable cassette allows each cassette to be individually accessed and serviced to alleviate the lack of space in enclosures. The design and ergonomics of the ejectable cassette significantly decrease the material usage and complexity, as compared to traditional cassettes. By replacing sliding trays with guide columns, the depth of the enclosure can be shortened dramatically because the enclosure no longer needs to accommodate the length of pull on the slide. Traditional trays, slides and mounting hardware can be eliminated, which reduces the overall weight and material usage. The design further reduces packaging and shipping costs for the system.

Creating the mounting tabs for the guide columns in the enclosure does not necessitate any additional post-processing or labor, because the mounting tabs in the enclosure can be created in the same forming steps as the enclosure itself. Regardless of whether the ejectable cassette is used in a 1U, 2U or 4U space, the same guide columns can be used, resulting in only one part for manufacturing. The guide column can be designed to use a standard A/B mold for production, which can simplify the overall manufacturing process. Such production can limit the bill of materials list, simplifies assembly in the factory, and simplifies on-site installation. All or a majority of the components of the ejectable cassette system can be configured or designed to be symmetrical such that the components can be installed in any direction or orientation, reducing assembly complexity and the training needed for both the manufacturer and the installer/customer.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. An ejectable cassette, comprising:
 a housing including a proximal end, a distal end, a first side, and a second side;
 a first locking mechanism assembly at the first side of the housing, the first locking mechanism assembly including a first locking tab slidably disposed along the first locking mechanism assembly, the first locking tab biased towards the proximal end of the housing; and
 a second locking mechanism assembly at the second side of the housing, the second locking mechanism assembly including a second locking tab slidably disposed along the second locking mechanism assembly, the second locking tab biased towards the distal end of the housing.

2. The ejectable cassette of claim 1, wherein the first locking tab is slidably disposed within a first channel of the first locking mechanism assembly and is configured to engage with a latch of a first guide column, and the second locking tab is slidably disposed within a second channel of the second locking mechanism assembly and is configured to engage with a latch of a second guide column.

3. The ejectable cassette of claim 2, wherein the first and second locking mechanism assemblies each include a hollow interior passage extending a partial length of the first and second locking mechanism assemblies, the first and second channels extending into the respective hollow interior passage.

4. The ejectable cassette of claim 3, comprising a spring disposed within the hollow interior passage, the spring biasing the respective first and second locking tabs.

5. The ejectable cassette of claim 4, comprising a stop wall disposed within the hollow interior passage.

6. The ejectable cassette of claim 5, wherein one end of the spring is disposed against the stop wall and an opposing end of the spring is disposed against or around an end of the respective first and second locking tabs.

7. The ejectable cassette of claim 1, wherein the first and second locking tabs each include a first end and a second end, the first end dimensioned greater in width than the second end, and a tapered section connecting the first and second ends.

8. The ejectable cassette of claim 7, wherein the first end of the first and second locking tabs defines a flat surface for engagement with a corresponding latch of a guide column.

9. A guide column, comprising:
- a central block;
- a first endpoint block aligned with the central block and disposed adjacent to a top surface of the central block;
- a second endpoint block aligned with the central block and the first endpoint block, and disposed adjacent to a bottom surface of the central block;
- a first release lever disposed between the central block and the first endpoint block; and
- a second release lever disposed between the central block and the second endpoint block.

10. The guide column of claim 9, wherein the central block includes a first pair of cassette rails extending from a first side of the central block, and a second pair of cassette rails extending from an opposing second side of the central block.

11. The guide column of claim 10, wherein the first and second pair of cassette rails extend parallel to each other and define a support slot between the respective cassette rails.

12. The guide column of claim 9, wherein the first endpoint block includes first and second single cassette rails extending from opposing sides of the first endpoint block, and the second endpoint block includes first and second single cassette rails extending from opposing sides of the second endpoint block.

13. The guide column of claim 12, wherein the first and second single cassette rails of the first endpoint block define a top surface of the guide column.

14. The guide column of claim 9, wherein the first endpoint block includes a first engagement mechanism extending from a top surface of the first endpoint block, and the second endpoint block includes a complementary second engagement mechanism.

15. The guide column of claim 14, wherein the first engagement mechanism includes female mounting tabs with an opening extending therethrough.

16. The guide column of claim 15, wherein the second engagement mechanism includes male mounting tabs configured to snap into the female mounting tabs or female mounting tabs of an enclosure.

17. The guide column of claim 9, wherein the first and second release levers each include first and second latches on opposing sides of an elongated extension.

18. The guide column of claim 9, wherein the first and second release levers each include first and second release tabs on opposing ends of an elongated extension.

19. An ejectable cassette system, comprising:
- a first guide column and a second guide column, each of the first and second guide columns including:
  - a central block;
  - a first endpoint block aligned with the central block;
  - a second endpoint block aligned with the central block and the first endpoint block;
  - a first release lever disposed between the central block and the first endpoint block; and
  - a second release lever disposed between the central block and the second endpoint block; and
- an ejectable cassette including:
  - a housing including a proximal end, a distal end, a first side, and a second side;
  - a first locking mechanism assembly at the first side of the housing, the first locking mechanism assembly including a first locking tab slidably disposed along the first locking mechanism assembly, the first locking tab biased towards the proximal end of the housing; and
  - a second locking mechanism assembly at the second side of the housing, the second locking mechanism assembly including a second locking tab slidably disposed along the second locking mechanism assembly, the second locking tab biased towards the distal end of the housing.

20. The ejectable cassette system of claim 19, wherein the first release lever and the second release lever of each of the first and second guide columns include a latch, and the first locking tab and the second locking tab of the ejectable cassette are configured to engage with the respective latch of the first and second release levers to releasably interlock the ejectable cassette with the first and second guide columns.

* * * * *